United States Patent [19]

Kawabata et al.

[11] Patent Number: 4,943,512
[45] Date of Patent: Jul. 24, 1990

[54] PHOTOCURABLE AND DYEABLE RESIN COMPOSITION WITH BISAZIDE AND DYEABLE ACRYLIC COPOLYMER

[75] Inventors: Hiroshi Kawabata; Katsuhiko Kobayashi; Hideo Sato, all of Yokohamashi, Japan

[73] Assignee: Chisso Corporation, Osaka, Japan

[21] Appl. No.: 253,078

[22] Filed: Oct. 4, 1988

[30] Foreign Application Priority Data

Nov. 12, 1987 [JP] Japan ................. 62-286184

[51] Int. Cl.$^5$ .................. G03C 1/60; G03C 1/71
[52] U.S. Cl. ........................ 430/197; 430/7; 430/23; 430/27; 430/28; 430/142; 430/145
[58] Field of Search ............... 430/197, 28, 145, 7, 430/23, 27, 142

[56] References Cited

U.S. PATENT DOCUMENTS

| | | | |
|---|---|---|---|
| 2,687,958 | 8/1954 | Neugebauer | 430/197 |
| 3,850,646 | 11/1974 | Wagner et al. | 430/197 |
| 4,086,090 | 4/1978 | Kohashi et al. | 430/28 |
| 4,219,587 | 8/1980 | Oba et al. | 430/28 |
| 4,220,700 | 9/1980 | McGuckin et al. | 430/145 |
| 4,526,854 | 7/1985 | Watanabe et al. | 430/28 |
| 4,614,701 | 9/1986 | Mori et al. | 430/145 |
| 4,820,619 | 4/1989 | Sanada et al. | 430/197 |

OTHER PUBLICATIONS

Kohashi, T. et al., *Photo. Sci & Eng.*, vol. 23, No. 3, 5-6/1979, pp. 168-171.
Noller, C., "Textbook of Organic Chemistry", 2nd Ed., W. B. Saunders Co., 1957, p. 549.

*Primary Examiner*—Charles L. Bowers, Jr.
*Attorney, Agent, or Firm*—Fred Philpitt

[57] ABSTRACT

A photocurable resin composition is described, which comprises a specific type of photosensitive polymer obtained by copolymerization of a monomer of the following general formula [I]

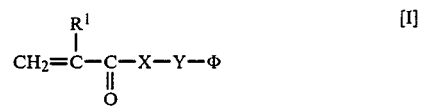

in which $R^1$ represents H, $CH_3$ or $C_2H_5$, X represents —O— or —NH—, Y represents a linear or branched hydrocarbon group having from 1 to 4 carbon atoms, and Φ represents

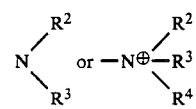

$Z^\ominus$, in which $Z^\ominus$ represents an anion, and $R^2$, $R^3$ and $R^4$ are independently an alkyl group having from 1 to 4 carbon atoms, and a monomer of the following general formula [II]

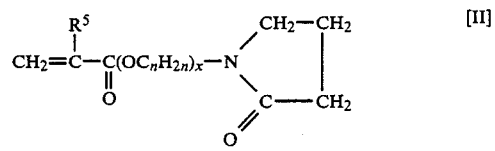

in which $R^5$ represents H, $CH_3$ or $C_2H_5$, and n and x are independently an integer of from 1 to 4. The photosensitive polymer is photocrosslinked with a diazide compound. The resin composition is particularly suitably for use in formation of a color filter because of good dyeability and good adhesion to a substrate.

15 Claims, 3 Drawing Sheets

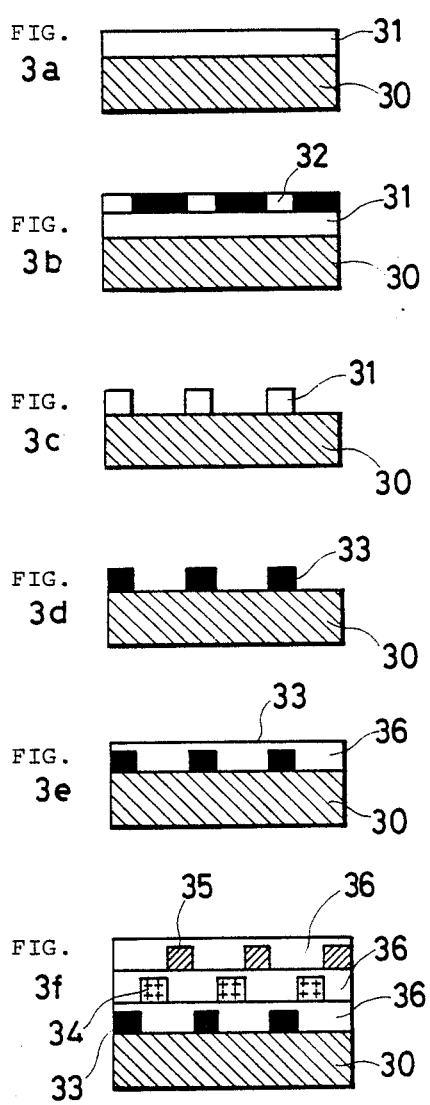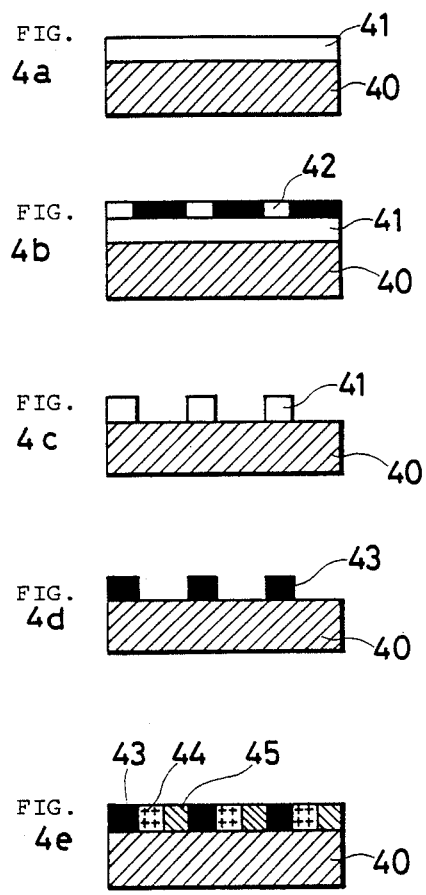

PHOTOCURABLE AND DYEABLE RESIN COMPOSITION WITH BISAZIDE AND DYEABLE ACRYLIC COPOLYMER

BACKGROUND OF THE INVENTION

1. Field of the Invention

This invention relates to photocurable resin compositions and more particularly, to photocurable resin composition which comprises a polymer compound having essentially an active hydrogen-bearing pyrrolidone ring and an amino group, substituted amino group or quaternary ammonium salt, and a bisazide compound as a photocrosslinking agent. The photocurable resin composition of the invention has good dyeability against acid dyes and is thus particularly suitable for use as a material for color filter used in color video cameras and liquid crystal color television sets. The composition is also applicable to the fields of processed parts in the field of electronics and ordinary photoresists such as plate-making materials in the printing industry.

2. Description of the Prior Art

For materials of forming a color filter, there have been widely used photosensitive compositions which comprise natural polymers such as gelatin, glue and the like and a hexavalent chromium compound, used as a photocrosslinking agent, such as ammonium bichromate, potassium bichromate and the like.

In application, such a photosensitive composition is applied onto a substrate such as glass, a solid state image pickup element or the like by a spin coating technique. Subsequently, the coated composition is subjected to ultraviolet exposure through a stripe or mosaic mask and developed to form a colorless transparent pattern on the substrate. This colorless transparent pattern is immersed in a solution containing a dye and dyed. A protective film such as of a resin is formed on the dye pattern. The above procedure is repeated to obtain an intended color filter.

Gelatin or glue is industrially advantageous in that it has god dyeability against acid dyes and good resolving power, and development with water is possible without use of organic solvents. However, since gelatin or glue is a natural polymer, it is difficult to obtain gelatin or glue which has a constant distribution of molecular weight or a constant concentration of amino group necessary for dyeing with acid dyes. Further, such a natural polymer is likely to undergo a so-called dark reaction in which a curing reaction similar to a photo-insolubilizing reaction takes place prior to or after the exposure. Accordingly, the photosensitive solution cannot be preserved over a long term, i.e. it has to be exposed to light and developed within a short time after coating on the substrate. In addition, the use of hexavalent chromium compounds harmful to a human body is also disadvantageous.

In order to overcome these disadvantages, attempts have been made. In such attempts, there has been proposed a photosensitive resin (Japanese Laid-open Patent Application No. Sho 59-48758) which is comprised chiefly of a copolymer of 4,5-methacroyloxychalcone and a tertiary amine having a copolymerizable unsaturated bond. There are also known a photosensitive resin composition (Japanese Laid-open Patent Application No. Sho 58-199342) which comprises as primary components a terpolymer of 2-hydroxyethyl methacrylate, 3-dimethylaminopropyl methacrylate and acrylamide and a diazo compound used as a photocrosslinking agent, and a photosensitive resin composition (Japanese Laid-open Patent Application No. Sho 59-155,412) which comprises a terpolymer of N-vinyl-2-pyrrolidinone, a monomer having a quaternary amine structure and a copolymerizable unsaturated bond, and an alkyl acrylate, and a bisazide compound as a crosslinking agent. Although the chalcone compound-containing composition is advantageous in that it does not use any hexavalent chromium and can suppress the dark reaction, a difficulty is involved from the viewpoint of industrial hygiene and management in that development with aqueous solvents is not possible and thus, organic solvents have to be used for the development.

The chalcone compound is of the type which is dimerized by application of light. In order to obtain a necessary film strength, the ratio of the chalcone groups in the copolymer should increase, with an attendant drawback that it is difficult to balance photosensitivity and dyeability.

The diazo compound-containing system is incomplete with respect to the suppression of the dark reaction and undergoes yellowing of the resin after curing. The composition obtained by adding a bisazide compound to the terpolyer containing N-vinylpyrrolidone has the drawback that it is slightly inferior in dyeability, so that fixation of a dye is very difficult.

SUMMARY OF THE INVENTION

It is accordingly an object of the invention to provide a photocurable resin composition which overcomes the drawbacks of the prior art compositions.

It is another object of the invention to provide a photocurable resin composition which can suppress a dark reaction and has thus good storage stability.

It is a further object of the invention to provide a photocurable resin composition which is free of hexavalent chromium harmful substances and which is likely to balance photosensitivity and dyeability.

It is a still further object of the invention to provide a photocurable resin composition which is developed with aqueous solvent without use of any organic solvent and in which a cured resin obtained from the resin composition has dyeability against acid dyes equal to or better than those obtained from known photosensitive compositions chiefly comprising gelatin or glue.

It is a still further object of the invention to provide a photocurable resin composition which is capable of yielding a cured resin whose resolving power in formation of color filters is equal to or better than that of cured products obtained from the known photosensitive compositions.

It is an additional object of the invention to provide a photocurable resin composition which permits easy fixation of dyes and a simple production process for a color filter.

We have made extensive studies on combinations of compounds having a dyeing function and compounds of a photosensitive function in order to overcome the drawbacks of known color filter-forming materials. As a result, it has been found that the problems involved in the prior art photosensitive or photocurable resin compositions can be solved when a photocurable resin composition comprised of a polymer obtained by copolymerization of monomers of the formulae [I] and [II] indicated below, and a bisazide compound.

According to the invention, there is provided a photocurable resin composition which comprises:

(A) a polymer which is obtained by copolymerization of a monomer of the following general formula [I]

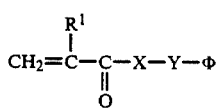

in which $R^1$ represents H, $CH_3$ or $C_2H_5$, X represents —O— or or —NH—, Y represents a linear or branched hydrocarbon group having from 1 to 4 carbon atoms, and Φ represents

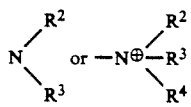

$Z^\ominus$, in which $Z^\ominus$ represents an anion, and $R^2$, $R^3$ and $R^4$ are independently an alkyl group having from 1 to 4 carbon atoms, and a monomer of the following general formula [II]

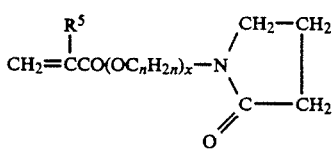

in which $R^5$ represents H, $CH_3$ or $C_2H_5$, and n and x are independently an integer of from 1 to 4; and (B) a bisazide compound used as a photocrosslinking agent for the polymer.

BRIEF DESCRIPTION OF THE DRAWINGS

FIGS. 3a to 3f are, respectively, schematic views showing a known procedure of forming a color filter; and FIGS. 4a to 4e are, respectively, schematic views showing a procedure of a color filter using the photocurable resin composition according to the invention.

DETAILED DESCRIPTION OF THE INVENTION

Figure 1:
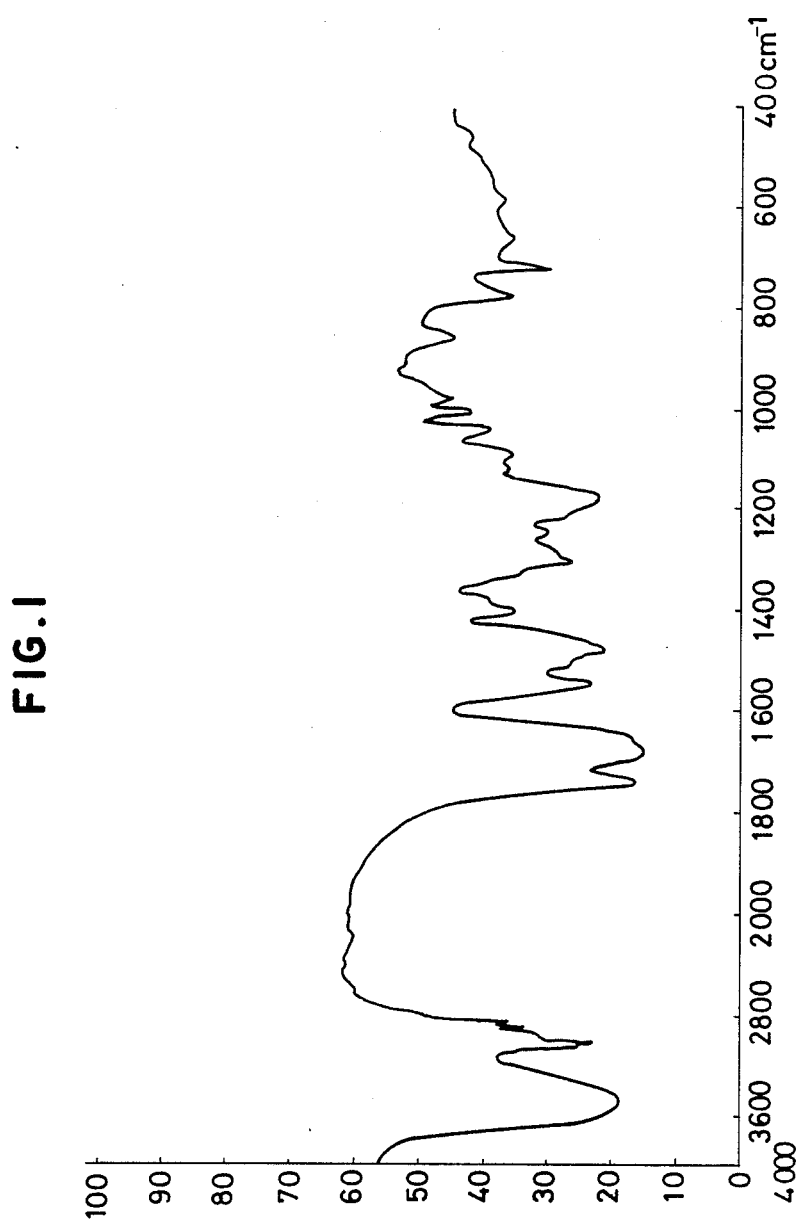
FIG. 1 is an IR absorption spectrum of a main component of a photocurable resin composition of Example 1 according to the invention.

The monomer represented by the above-indicated general formula [I] serves to enhance the function of dyeability and the solubility in water. The ratio of the moieties or units of the formula [I] in the copolymer according to the invention should be preferably from 10 to 80 mole% in view of the requirements for the dyeability and solubility in water.

Specific examples of the monomer of the formula [I] in which Φ represents

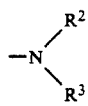

are mentioned below:

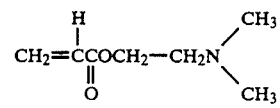

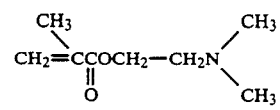

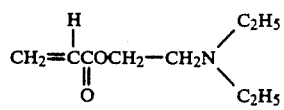

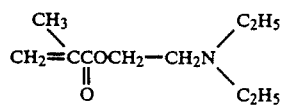

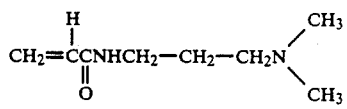

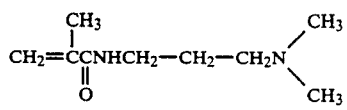

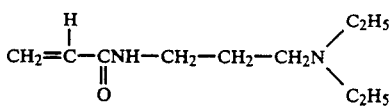

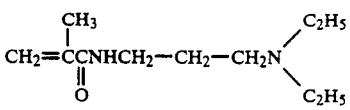

and the like.

Likewise, specific examples of the formula [I] wherein Φ represents

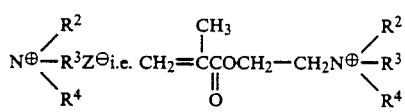

$Z^\ominus$ include those compounds of the following formulae

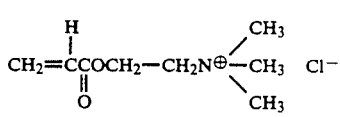

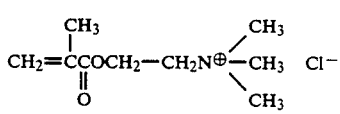

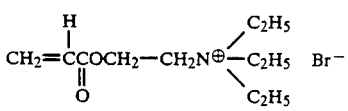

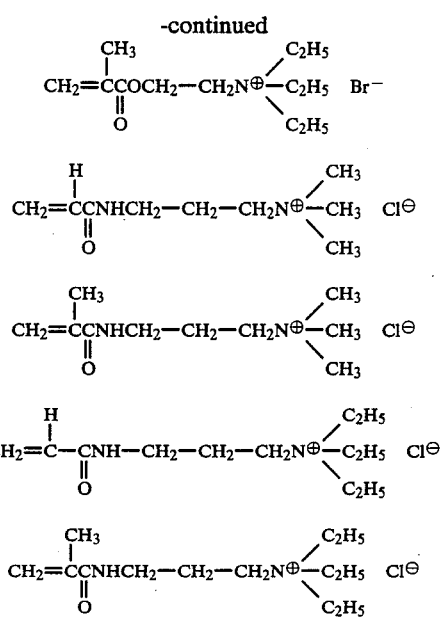

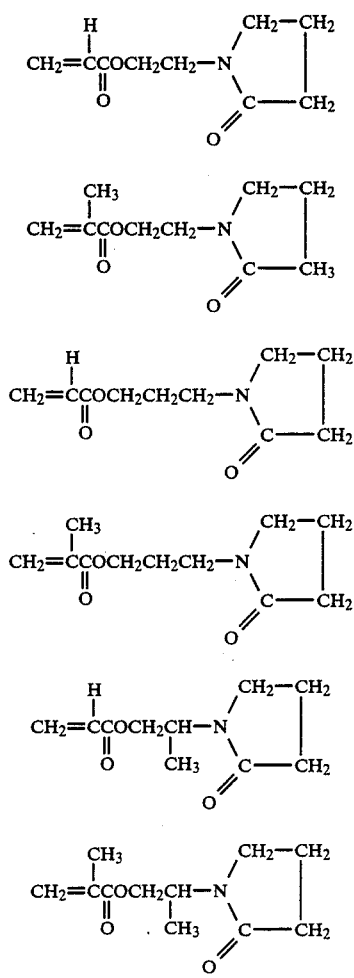

and mixtures thereof.

Specific examples of the monomer of the general formula [II] copolymerizable with the monomer of the formula [I] are mentioned below:

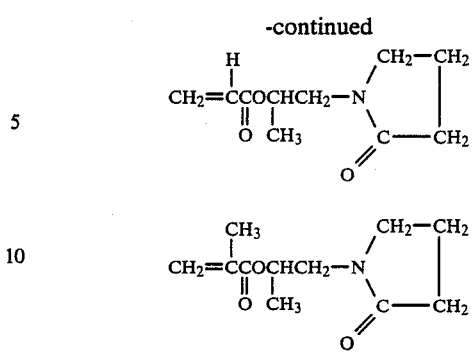

and mixtures thereof.

The moieties or units of the formula [II] in the copolymer has suh a function that the active hydrogen in the pyrrolidinone ring reacts with a diazide compound decomposed by light irradiation and is crosslinked to insolubilize the copolymer in solvents, thereby depositing the crosslinked copolymer on a substrate used to form a color filter. In the photocurable resin composition of the invention, the amount of the units of the formula [II] in the copolymer is from 5 to 80 mole%, preferably from 10 to 70 mole%. If the amount is less than 5 mole%, disadvantages such as a lowering of resolution and insufficiency of the resultant film strength may be unfavorably produced. Over 80 mole%, the structural units containing the amino groups are correspondingly reduced, leading to poor dyeability.

Other monomers copolymerizable with these monomers may be used including, for example, vinyl compounds such as acrylic acid, methacrylic acid, acrylic esters, methacrylic esters, vinyl acetate, styrene and the like. These other monomers are added in amounts not impeding the dyeability and solubility in water. More particularly, the amount should be less than 50 wt %, preferably not larger than 30 wt %, of the total amount of the monomers used. By this, the adhesiveness of the resultant copolymer can be improved.

The copolymerization process is not limited to any specific ones but the copolymer is usually prepared by a radical polymerization process using radical initiators. The polymerization may be effected by any of bulk polymerization, solution polymerization, suspension polymerization or emulsion polymerization. For the preparation of a photosensitive solution using the copolymer, it is convenient to use the solution polymerization.

The polymerization conditions are not critical and generally include a temperature of from 50° to 150° C., preferably from 60° to 120° C. and a time of from 30 minutes to 10 hours, preferably from 1 to 6 hours.

After completion of the polymerization, a solvent used for the polymerization and unreacted monomers are preferably separated from the reaction system in a nonsolvent for the resultant copolymer, followed by drying to obtain the copolymer.

The diazide compounds for imparting photocurability to the composition of the invention include diazidostilbenes such as 4,4'-diazidostilbene, phenylenebisazides such as phenylenebisazide, diazidobenzophenones such as 4,4'-diazidobenzophenone, diazidobenzalacetones such as 2,6-Di(4'-azidobenzal)-4-methylcylohexane, and sulfonates of these compounds.

The diazides are used in an amount of from 0.5 to 20 wt %, preferably from 1 to 10 wt %, of the copolymer. Amounts less than 0.5 wt % are not satisfactory with respect to the curing of the resin. Over 20 wt %, a resin film prior to dyeing may be colored, or its dyeability may lower.

The bisazides may be used in combination with photosensitizers. Examples of the photosensitizers include benzophenones such as Michler's ketone, and aromatic nitro compounds such as 5-nitroacenaphthene, 1-nitropyrene and the like.

The photosensitizers are used in an amount from 1 to 10 wt %, preferably from 3 to 7 wt %, of the copolymer. Over 10 wt %, the strength of the resultant film unfavorably lowers.

As will be apparent from the foregoing, the present invention is characterized by the combination of a copolymer containing a compound of the formula [II] and a bisazide compound. The active hydrogen-bearing pyrrolidone rings are remote from the main chain of the polymer through the alkyl chain. Accordingly, a loose network structure is formed when a bisazide compound is decomposed by irradiation of light to cure the resin composition through the pyrrolidinone rings. Thus, dye molecules can incorporate readily into the cured resin, imparting good dyeability and ensuring satisfactory fixation of the dye in the resin by use of tannic acid or tartar emetic. The strucutral units of the formula [II] can strengthen adhesiveness of the resin to a substrate, so that good adhesiveness of the resin to the substrate is obtained without pretreatment of the substrate such as with silane coupling agents.

Since fixation of a dye in a dyeing step using the photocurable resin composition is easier than a known step as particularly shown in FIG. 3, a color filter is made by a simpler procedure as is shown in FIG. 4. In the known procedure of FIG. 3, a substrate 30 having a photosensitive film 31 is first provided. An exposure mask 32 is provided on the film 31, which is subsequently exposed to light and developed to form a cured film pattern on the substrate 30 as shown in FIG. 3c. This cured film pattern is dyed with a suitable dye to form a dyed pattern 33 as in FIG. 3d. Thereafter, an intermediate layer 36 is formed to cover the dyed pattern 33, followed by repeating the above procedure to form dyed patterns 34, 35 in the respective intermediate layers 36 as is shown in FIG. 3f. This procedure is apparently more complicated than the procedure of FIG. 4 using the photocurable resin composition of the invention. This procedure is particularly described hereinafter in Example 1.

The advantages of the photocurable resin composition of the invention particularly for use as a color filter-forming material are summarized as follows.

(a) Good storage stability, i.e. when stored in the cold and dark, the composition can stand use over 1 month.

(b) No hexavelent chromium compounds harmful to a human body is contained.

(c) Very good adhesiveness to a substrate is ensured without pretreatment of the substrate such as with silane coupling agents.

(d) Development with aqueous solvents is possible with little danger being involved in working environments from the industrial hygienic standpoint.

(e) Good dyeability against acid dyes, i.e. a required dye density can be obtained in a thin film in a dye bath of a relatively low temperature within a short time.

(f) High resolving power substantially equal to that of known photosensitive compositions using gelatin or glue is obtained.

(g) Since dyes are easily fixed, color filters can be made more simply than in known procedures.

The above advantages are required to photosensitive resin when used as a material for color filter. The photocurable resin composition of the invention can satisfy all the above requirements.

The present invention is described in more detail by way of examples, which should not be construed as limiting the invention.

| Example 1 | |
|---|---|
| [I] N-(3-dimethylaminopropyl)methacrylamide | 30.0 g |
| [II] N-(2-methacryloxyethyl)pyrrolidone | 20.0 g |
| Styrene | 5.0 g |
| Azobisisobutyronitrile | 0.15 g |
| Isopropyl cellosolve | 100 ml |

A mixture of the above formulation was placed in a flask equipped with an agitator. After passage of a nitrogen gas for 1 hour, the mixture was heated and agitated at 70° C. for 4 hours to effect the polymerization reaction. After completion of the reaction, the reaction mixture was charged into a large amount of ethyl acetate to cause the product to precipitate.

Subsequently, the ethyl acetate containing the reaction solution was removed by decantation, followed by drying the reaction product under reduced pressure to obtain 31g of a polymer.

The IR absorption spectrum of the polymer is shown in FIG. 1. The polymer was used to prepare a photosensitive solution of the following formulation.

| Polymer | 10 g |
|---|---|
| Sodium 4,4'-diazidostilbene-2,2'-disulfonate | 0.5 g |
| Isopropyl cellosolve | 100 ml |
| Dimethylacetamide | 10 ml |

This photosensitive solution was used to make a color film according to the steps illustrated in FIG. 4.

In step 4a, the photosensitive solution was applied onto a glass substrate 40 by a spin coating technique and dried at 120° C. for 10 minutes to form a coating film 41.

In step 4b, the film 41 was irradiated with ultraviolet rays at a surface illumination of 12 mW/cm$^2$ for 15 seconds.

In step 4c, the irradiated film was developed with pure water of 25° C. for 30 seconds to form a cured pattern 41, followed by heating at 150° C. for 30 minutes. The pattern had a film thickness of 0.5 micrometers with a resolution of 4 micrometers. No separation of the pattern portion was recognized and thus, adhesion to the substrate was good.

In step 4d, the pattern portion was immersed in an aqueous solution containing 1 wt % of a green dye G1P (Nippon Chem. Co., Ltd.) at a temperature of 65° C. for 10 minutes and dyed.

Thereafter, the dyed pattern 43 was immersed in an aqueous solution containing 1 wt % of tannic acid at 60° C. for 1 minute and then in an aqueous solution containing 1 wt % of tartar emetic at 60° C. for 1 minute, thereby fixing the dye. After the fixing treatment, the thickness of the film was 0.9 micrometer with an optical density of 1.0. Thus, the dyeability was good.

Subsequently, the green pattern-bearing substrate was subjected to the steps of 4a and 4d except that the dyeing step was effected using a red dye R13P (Nippon Chem. Co., Ltd.), thereby dyeing a pattern with the red dye. As a result, there was formed a clear red pattern portion 44 with an optical density of 2.2 without causing any decoloration and color mixing at the green pattern portion 43.

The substrate on which the green and red patterns had been formed was subjected to the steps 4a to 4d except that the dyeing step was effected using a blue dye B7P (Nippon Chem. Co., Ltd.) thereby dyeing a pattern the blue dye. As a result, there was formed a clear blue pattern portion 45 with an optical density of 1.9 without causing any decoloration and color mixing at the green and red pattern portions 43, 44.

In the known fabrication procedure shown in FIG. 3, the intermediate layers 36 as shown in step 3e have to be formed in order to prevent the decoloration and color mixing. Accordingly, the resultant color filter is in the form of a multi-layered structure as shown in FIG. 3f, making it difficult to register the pixels. On the other hand, the color filter formed using the photocurable resin composition of the invention has the respective color patterns as a single layer as is particularly shown in FIG. 4e. Not only the process can be simplified, but also the registration of the respective color pixels is easy.

| Example 2 | |
|---|---|
| [I] N-(3-dimethylaminopropyl)methacrylamide | 30.0 g |
| [II] N-(3-methacryloxypropyl)pyrrolidone | 20.0 g |
| 2-Hydroxyethyl methacrylate | 5.0 g |
| Azobisisobutyronitrile | 0.15 g |
| Isopropyl cellosolve | 100 ml |

A mixture of the above formulation was polymerized and purified under the same conditions as in Example 1 to obtain 25g of a polymer.

Figure 2:
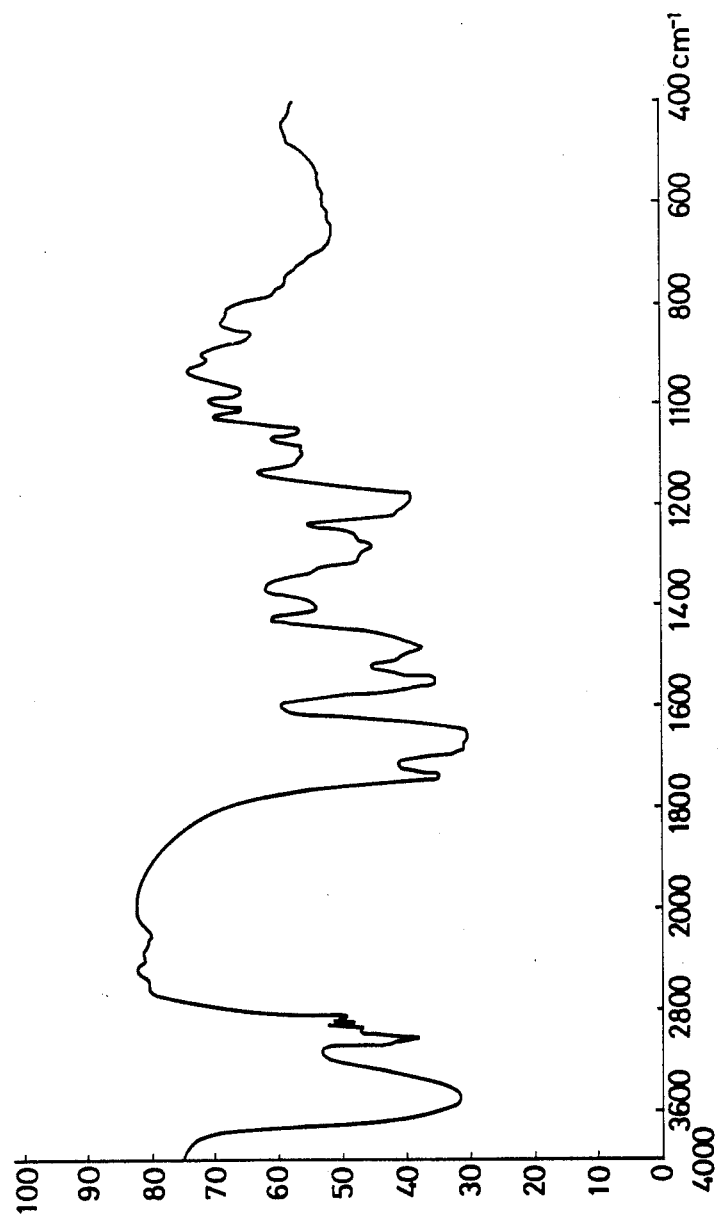
FIG. 2 is an IR absorption spectrum of a copolymer of Example 2.

The IR absorption spectrum of the polymer is shown in FIG. 2. The polymer was used to prepare a photosensitive solution of the following formulation.

| Polymer | 10 g |
|---|---|
| 2,6-Di(4'-azidobenzal)-4-methylcyclohexanone | 0.2 g |
| Isopropyl cellosolve | 100 ml |
| Dimethylacetamide | 10 ml |

This photosensitive solution was used to form a color filter on a glass substrate in the same manner as in Example 1. As a result, clear green, red and blue patterns were formed without causing any decoloration and color mixing.

EXAMPLE 3

The photosensitive solution prepared in Example 1 was stored in a brown bottle covered with a light-shielding paper sheet at 10° C. for 30 days, followed by subjecting the solution to exposure to light, development, dyeing and dye-fixing steps under the same conditions as in Example 1.

The characteristics such as the sensitivity, resolution, optical density and dye-fixing were almost the same as those immediately after the preparation of the photosensitive solution, thus revealing that the storage stability was good.

| Comparative Example 1 | |
|---|---|
| N-Vinyl-2-pyrrolidone | 34.0 g |
| 2-Methacryloxyethyltrimethylammonium chloride | 7.0 g |
| Methyl methacrylate | 9.0 g |
| Azobisisobutyronitrile | 0.2 g |
| Methanol | 200 ml |

A mixture of the above formulation was placed in a flask equipped with an agitator. After passage of a nitrogen gas for 1 hour, the mixture was heated and agitated at 65° C. for 5 hours for polymerization. After completion of the polymerization, the reaction mixture was charged into a large amount of ethyl acetate to cause the resultant product to precipitate, followed by washing with petroleum ether and drying under reduced pressure.

10g of the polymer was dissolved in 100 ml of methyl cellosolve, to which 0.5g of sodium 4,4'-diazidostilbene-2,2'-disulfonate dissolved in 10 ml of dimethylacetamide was added, thereby obtaining a photosensitive solution.

This photosensitive solution was used to form a green, red and blue color filter on a substrate in the same manner as in Example 1. However, it was found that the green dye G1P and the red dye R137P could not be fixed, and decoloration was observed. Thus, the color filter for the three colors could not be formed.

| Comparative example 2 | |
|---|---|
| Gelatin | 20.0 g |
| Water | 100 ml |
| Ammonium bichromate | 2.0 g |
| Alcohol | 6 ml |

A photosensitive solution of the above formulation was prepared. This photosensitive solution was applied onto a glass substrate by spin coating and heated at 80° C. for 10 minutes, followed by exposure to a ultraviolet ray at a surface illumination of 12 mW/cm$^2$ for 15 seconds. Thereafter, the exposed film was developed with hot water of 40° C. for 30 seconds.

The film thickness after drying at 100° C. for 5 minutes was 0.7 micrometers with a resolution of 3 micrometers. The film was immersed in an aqueous solution containing 1 wt % of a green dye G1P at 70° C. for 10 minutes and dyed. After the dyeing, the film thickness was 0.9 micrometers with an optical density of 0.5.

The photosensitive solution was stored at 10° C. for 5 days, after which it was used to form a pattern as described above and dyed with G1P. The film thickness before the dyeing was 0.8 micrometers with a resolution of 6 micrometers. After the dyeing, the film thickness was 0.9 micrometers with an optical density of 0.2.

From the above, it was found that the dark reaction proceeded in the solution during the storage, causing the solution to be changed in quality.

What is claimed is:

1. A photocurable, photosensitive and dyeable resin composition which comprises a mixture of
   (A) a polymer which is obtained by a copolymerizable of a first monomer of the general formula [I]

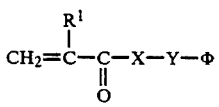 [I]

in which $R^1$ represents H, $CH_3$ or $C_2H_5$, X represents —O— or —NH—, Y represents a linear or branched hydrocarbon group having from 1 to 4 carbon atoms, and Φ represents

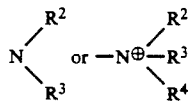

$Z^\ominus$, in which $Z^\ominus$ represents an anion, and $R^2$, $R^3$ and $R^4$ are independently an alkyl group having from 1 to 4 carbon atoms, and at least one other monomer of the general formula [II]

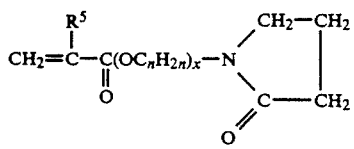 [II]

in which $R^5$ represents H, $CH_3$ or $C_2H_5$, and n and x are independently an integer of from 1 to 4; with (B) a bisazide compound used as a photocross-linking agent for the polymer, the quantity of said bisazide compound being 1 to 10% by weight based on said polymer (A).

2. A photocurable, photosensitive and dyeable resin composition according to claim 1 wherein the polymer is obtained by copolymerization of the monomers of the formulae [I] and [II] and at least one additional monomer selected from the group consisting of acrylic acid, methacrylic acid, acrylic esters, methacrylic esters, vinyl acetate and styrene, said at least one monomer being used in an amount of less than 50 wt % of the total amount of the monomers of the formulae [I] and [II].

3. A photocurable, photosensitive and dyeable resin composition according to claim 1, wherein said bisazide compound is present in an amount of from 0.5 to 20 wt % of the polymer.

4. A photocurable, photosensitive and dyeable resin composition according to claim 3 wherein said photosensitizer is present in an amount of from 1 to 10 wt % based on the polymer.

5. A photocurable, photosensitive and dyeable resin composition according to claim 1 which also includes a photosensitizer.

6. A photocurable, photosensitive and dyeable resin composition which comprises a mixture of (A) a polymer which is obtained by a copolymerization of a first monomer of the general formula [I]

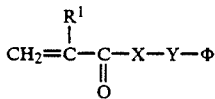 [I]

in which $R^1$ represents H, $CH_3$ or $C_2H_5$, X represents —O—, Y represents a linear or branched hydrocarbon group having from 1 to 4 carbon atoms, and Φ represents

and $R^2$, and $R^3$ are independently an alkyl group having from 1 to 4 carbon atoms, and at least one other monomer of the general formula [II]

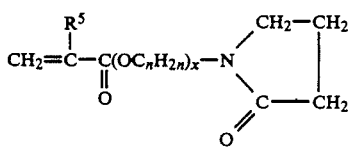 [II]

in which $R^5$ represents H, $CH_3$ or $C_2H_5$, and n and x are independently an integer of from 1 to 4; with (B) a bisazide compound used as a photocross-linking agent for the polymer, the quantity of said bisazide compound being 1 to 10% by weight based on said polymer (A).

7. A photocurable, photosensitive and dyeable resin composition according to claim 6 wherein the polymer is obtained by copolymerization of the monomers of the formulae [I] and [II] and at least one additional monomer selected from the group consisting of acrylic acid, methacrylic acid, acrylic esters, methacrylic esters, vinyl acetate and styrene, said at least one monomer being used in an amount of less than 50 wt % of the total amount of the monomers of the formulae [I] and [II].

8. A photocurable, photosensitive and dyeable resin composition according to claim 6 wherein said bisazide compound is present in an amount from 0.5 to 20 wt % of the polymer.

9. A photocurable, photosensitive and dyeable resin composition according to claim 6 which also includes a photosensitizer.

10. A photocurable, photosensitive and dyeable resin composition according to claim 9 wherein said photosensitizer is present in an amount of from 1 to 10 wt % based on the polymer.

11. A photocurable, photosensitive and dyeable resin composition which comprises a mixture of (A) a polymer which is obtained by a copolymerization of a first monomer selected from the group consisting of

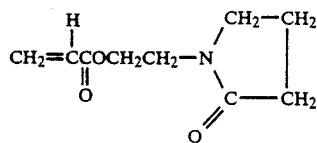

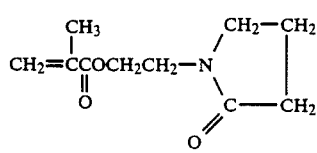

-continued

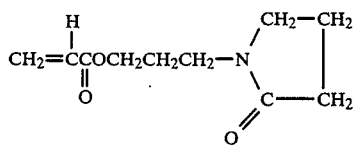

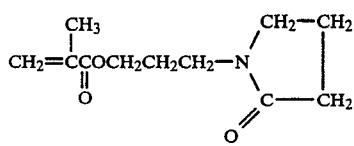

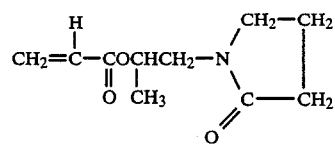

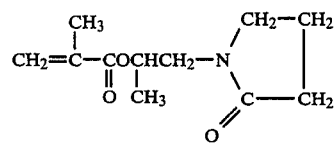

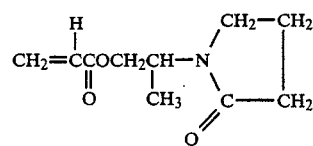

-continued

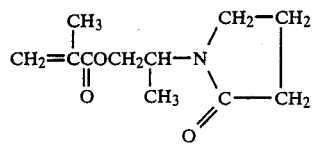

and at least one other monomer of the general formula [II]

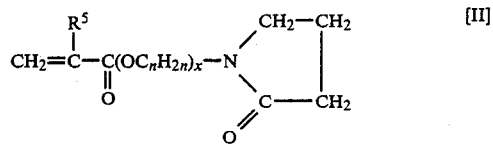

in which $R^5$ represents H, $CH_3$ or $C_2H_5$, and n and x are independently an integer of from 1 to 4; with
  (B) a bisazide compound used as a photocross-linking agent for the polymer, the quantity of said bisazide compound being 1 to 10% by weight based on said polymer (A).

12. A photocurable, photosensitive and dyeable resin composition according to claim 11 wherein the polymer is obtained by compolymerization of said first monomer, said monomer of formula [II] and at least one additional monomer selected from the group consisting of acrylic acid, methacrylic acid, acrylic esters, methacrylic esters, vinyl acetate and styrene, said at least one monomer being used in an amount of less than 50 wt % of the total amount of the monomers of the formula [I] and [II].

13. A photocurable, photosensitive and dyeable resin composition according to claim 11 wherein said bisazide compound is present in an amount of from 0.5 to 20 wt % of the polymer.

14. A photocurable, photosensitive and dyeable resin composition according to claim 11, which also includes a photosensitizer.

15. A photocurable, photosensitive and dyeable resin composition according to claim 14 wherein said photosensitizer is present in an amount of from 1 to 10 wt % based on the polymer.

* * * * *